United States Patent [19]
Horiuchi et al.

[11] Patent Number: 6,004,865
[45] Date of Patent: Dec. 21, 1999

[54] METHOD OF FABRICATING MULTI-LAYERED STRUCTURE HAVING SINGLE CRYSTALLINE SEMICONDUCTOR FILM FORMED ON INSULATOR

[75] Inventors: Masatada Horiuchi, Koganei; Takahiro Onai, Ome; Katsuyoshi Washio, Tokorozawa, all of Japan

[73] Assignee: Hitachi, Ltd., Tokyo, Japan

[21] Appl. No.: 08/612,647

[22] Filed: Mar. 8, 1996

Related U.S. Application Data

[62] Division of application No. 08/291,652, Aug. 16, 1994, Pat. No. 5,523,602.

[30] Foreign Application Priority Data

Sep. 6, 1993 [JP] Japan .................................. 5-221193
Feb. 2, 1994 [JP] Japan .................................. 6-010782

[51] Int. Cl.[6] ...................... H01L 21/331; H01L 21/336; H01L 21/20
[52] U.S. Cl. .......................... 438/459; 438/311; 438/164; 438/157; 438/977
[58] Field of Search ........................ 437/21, 62; 438/149, 438/151, 157, 164, 455, 459, 977, FOR 485, 311, 359, 691–693, 312, 318, 322, 234

[56] References Cited

U.S. PATENT DOCUMENTS

| | | | |
|---|---|---|---|
| 4,233,211 | 11/1980 | Hayashi et al. | 257/347 |
| 4,355,330 | 10/1982 | Hisamoto et al. | 257/71 |
| 4,596,604 | 6/1986 | Akiyama et al. | 257/74 |
| 4,704,785 | 11/1987 | Curran . | |
| 4,875,086 | 10/1989 | Malhi et al. | 257/351 |
| 4,974,041 | 11/1990 | Grinberg | 257/347 |
| 4,980,308 | 12/1990 | Hayashi et al. . | |
| 4,983,251 | 1/1991 | Haisma et al. . | |
| 5,013,681 | 5/1991 | Godbey et al. . | |
| 5,168,078 | 12/1992 | Reisman et al. . | |
| 5,233,218 | 8/1993 | Miura | 257/347 |
| 5,266,511 | 11/1993 | Takao . | |
| 5,310,451 | 5/1994 | Tejaweni et al. . | |
| 5,324,678 | 6/1994 | Kusunoki . | |
| 5,355,022 | 10/1994 | Sugahara et al. | 257/768 |
| 5,366,923 | 11/1994 | Beyer et al. . | |
| 5,391,257 | 2/1995 | Sullivan et al. . | |
| 5,395,481 | 3/1995 | McCarthy . | |
| 5,395,789 | 3/1995 | Beitman . | |
| 5,455,193 | 10/1995 | Egloff . | |
| 5,455,202 | 10/1995 | Malloy et al. . | |
| 5,488,012 | 1/1996 | McCarthy . | |
| 5,492,859 | 2/1996 | Sakaguchi et al. . | |
| 5,536,361 | 7/1996 | Kondo et al. . | |
| 5,580,802 | 12/1996 | Mayer et al. . | |
| 5,585,304 | 12/1996 | Hayashi et al. . | |
| 5,618,739 | 4/1997 | Takahashi et al. | 438/158 |
| 5,670,411 | 9/1997 | Yonehara et al. . | |
| 5,728,624 | 3/1998 | Linn et al. | 438/459 |

FOREIGN PATENT DOCUMENTS

| | | | |
|---|---|---|---|
| 4-69966 | 3/1992 | Japan | 257/347 |
| 4-115572 | 4/1992 | Japan | 257/347 |
| 4-192359 | 7/1992 | Japan | 257/347 |
| 4-215473 | 8/1992 | Japan | 257/350 |
| 4-356929 | 12/1992 | Japan . | |

*Primary Examiner*—Mary Wilczewski
*Attorney, Agent, or Firm*—Kenyon & Kenyon

[57] ABSTRACT

Disclosed is an multi-layered SOI substrate, which includes a supporting substrate, and a first insulator, a semiconductor film, a second insulator and a single crystalline semiconductor film (SOI film) which are layered on the main surface of the supporting substrate The SOI substrate is formed by a direct bonding technique, and a bipolar transistor and an MOS transistor are formed using the single crystalline semiconductor film (SOI layer). The extremely shallow junction can be formed without epitaxial growth, thereby significantly increasing the operation speed of the semiconductor device at a low cost.

5 Claims, 11 Drawing Sheets

METHOD OF FABRICATING MULTI-LAYERED STRUCTURE HAVING SINGLE CRYSTALLINE SEMICONDUCTOR FILM FORMED ON INSULATOR

This application is a division of Ser. No. 08/291,652 filed Aug. 16, 1994 now U.S. Pat. No. 5,523,602.

BACKGROUND OF THE INVENTION

The present invention relates to a multi-layered structure and a method of fabricating the structure, and to a semiconductor device fabricated using the multi-layered structure and a method of fabricating the semiconductor device. In particular, the present invention concerns a multi-layered structure having an ultra-thin single crystalline semiconductor film formed on an insulator and a method of fabricating the structure, and an MOS transistor and a bipolar transistor formed using the ultra-thin single crystalline semiconductor layer, and a method of fabricating these transistors.

The structure shown in FIG. 2 is well-known; a single crystalline Si layer 3 is formed on a supporting substrate (Si substrate) 1 by-way of an insulator 2. This is generally called an SOI (Silicon on Insulator) substrate. The SOI substrate is fabricated by the steps of implanting highly concentrated oxygen ions on the surface region of the Si substrate 1 for forming silicon dioxide, and recovering crystal defects near the surface for single crystallization and enhancing the quality of a buried oxide film 2 by heat-treatment at a high temperature.

Alternatively, the SOI substrate is fabricated by the steps of directly bonding a second single crystalline Si substrate 3 to a silicon dioxide film 2 formed on a single crystalline Si substrate 1 without any adhesive, and then grinding and polishing the second Si substrate 3 from the rear surface side for thinning the thickness of the second Si substrate 3, thereby forming a structure in which the silicon dioxide film 2 is buried under the thin single crystalline Si film 3.

In this way, an SOI substrate, in which an ultrathin single crystalline semiconductor layer having a thickness of 100 to 200 nm is formed on an insulator, can be formed. Such an SOI substrate has been practically used as a substrate for an ultra-thin SOI (Silicon On Insulator) MOS transistor. In the ultrathin SOI MOS transistor using this SOI substrate, a source/drain junction can be directly formed on a thick buried oxide film, so that a source/drain stray capacitance can be reduced to be half or less that of the conventional one. The gate capacitance and the metallization stray capacitance can be also significantly reduced by the effect of the buried oxide film, thus enabling the operation of the transistor to be performed at an increased speed. Moreover, the fabrication method can be significantly simplified using the SOI substrate, for example, a well formation process can be eliminated, so that the fabrication cost can be significantly reduced.

A bipolar transistor using the SOI (Silicon On Insulator) substrate, as shown in FIG. 3, is also well-known. In FIG. 3, numeral 1 designates a supporting substrate made of a single crystalline silicon (Si); 2 is a silicon oxide film; and 3 is an SOI layer made of a single crystalline silicon (in this specification, a single crystalline semiconductor layer formed on an insulator is referred to as the SOI layer).

An n-type highly concentrated collector region 4 is selectively formed within the SOI layer 3, and a thin single crystalline silicon layer is formed on the main surface of the SOI layer 3 by a known epitaxial growth process. In FIG. 3, numeral 5 designates a-region separation insulator, 6 is a device isolation insulator, 7 is a field oxide, and 8 is a p-type intrinsic base region; all are formed on the above single crystalline silicon layer. Moreover, numeral 9 designates a base leadout electrode, 10 is an electrode protection insulator, 11 is an emitter-base separation insulator, 12 is a base leadout electrode, 13 is a graft base region, which are formed by diffusion of impurities from the base leadout electrode 9. Numeral 15 designates an emitter region, and 16, 17 and 18 are emitter, base, and collector metal electrodes, respectively.

The transistor shown in FIG. 3, which is perfectly separated from the silicon substrate 1 by the insulator 2, has features to reduce the collector-substrate capacitance thereby increasing the operation speed, and to prevent error in circuit operation and noise due to charge generated in the substrate by α-ray irradiation.

In the structure shown in FIG. 3, the film thickness of the SOI layer 3 is generally made to be as thick as 1 μm or more for sufficiently lowering the resistance of the collector region 4; accordingly, the SOI layer in this structure is different from that used for the ultra-thin SOI MOS transistor.

The MOS transistor is suitable for forming a microstructure, that is, for achieving high integration when compared to the bipolar transistor, but is not suitable for high speed operation because the drivability is inferior to that of the bipolar transistor. For realizing a large scale integration circuit of high speed and high integration, a circuit having the MOS transistor combined with the bipolar transistor has been extensively used, and is called a BiCMOS circuit. In this case, by forming the MOS transistor within the thin SOI layer, it becomes possible to improve the drivability by the effect of reducing the stray capacitance. However, this is not sufficient yet in the high speed performance as a high speed semiconductor device used for a large size computer.

If the BiCMOS circuit is formed within the thin SOI layer, it becomes possible to realize a large scale integrated circuit which has excellent combined characteristics of both an MOS transistor capable of further enhancing the integration and a bipolar transistor being excellent in the drivability and capable of achieving the high speed operation, and hence to improve the performance of a large size computer or the like.

A technique of fabricating a bipolar transistor within a thin SOI layer has been disclosed by the present inventors in Unexamined Japanese Patent Publication No. HEI 3-130977. However, a bipolar transistor described in this document is the so-called lateral transistor in which an emitter, a base and a collector are disposed in the lateral direction, and the base width is determined by the minimum future size and the condition of impurity diffusion. Although the base, width can be controlled to be 50 nm or less using the recent impurity diffusion technique, the minimum future size by etching, which is dependent on the exposing method, is substantially limited to several hundred nm, with a large variation.

On the other hand, the vertical transistor, in which an emitter, a base and a collector are disposed in the vertical direction, has been improved in the performance by thinning the width of an intrinsic collector, the base width and the like, and thereby realized the high speed operation. In this vertical transistor, however, it has been difficult to extremely lower the lateral dimension because of a limitation in fabrication of a micro-structure, and hence to further improve the high speed operation.

Therefore, according to the prior art methods, it has been difficult to fabricate an MOS transistor having an ultra-high integration density and a vertical bipolar transistor enabling a high speed operation within the same thin SOI layer.

SUMMARY OF THE INVENTION

To solve the above problems of the prior arts, the present invention has been made, and an object of the present invention is to provide an SOI substrate having an SOI layer which is capable of forming a semiconductor device having an ultra-high integration density and a high speed operation, and a method of fabricating the SOI substrate.

Another object of the present invention is to provide an ultra-thin SOI bipolar transistor having a high speed operation and an ultra-thin SOI MOS transistor having a high integration density which are simultaneously formed on the above ultra-thin SOI substrate.

A further object of the present invention is to provide a high performance bipolar transistor capable of reducing a collector resistance, making shallow the junction of an intrinsic collector region, eliminating an epitaxial growth process, and reducing the fabricating cost when compared to the prior art bipolar transistor shown in FIG. 3.

To achieve the above object, according to the present invention, there is provided an SOI substrate having a multi-layered structure in which two substrates are directly bonded with each other without any adhesive. The bonding ability between two substrates is not dependent on the materials of the surfaces but on the microscopic and macroscopic flatness of each of the two surfaces to be bonded. Accordingly, even if various insulators or semiconductor thin films are formed on the main surfaces of the substrates, the two surfaces can be directly bonded with each other without any hindrance so long as the flatness of the surfaces of the uppermost films are sufficiently good.

Accordingly, the above bonding technique makes it possible to easily realize a multi-layered SOI substrate in which multi-layer films such as the designed semiconductor film and an insulator are buried in the interior thereof.

After the above multi-layered SOI substrate is formed by directly bonding the two substrates with each other, the thickness of the one semiconductor substrate is thinned by grinding and polishing up to a specified value from the rear surface side of the one semiconductor substrate, and finishing by etching. The multi-layered SOI substrate can be thus obtained, in which a thin oxide film, a thin silicon film, a thick oxide film and the like are buried under an ultra-thin single crystalline semiconductor layer (SOI layer) having a thickness of several hundred nm.

In the above multi-layered SOI substrate, a device isolation insulator extending from the surface of the SOI layer to the thick oxide film is formed, and thereafter a semiconductor device such as a transistor is formed on an active region of the SOI layer by the known method. In this case, unlike the prior art method, regions for an intrinsic base 8, a base leadout electrode 9, a graft base 13, an emitter 15 and the like can be formed without formation of a high concentrated collector region 4 and an epitaxial layer.

After that, an opening portion reaching the silicon film is formed on a region, on which the collector leadout region 12 is formed in the prior art method, and the silicon film in the lower portion of the active region is selectively removed, to form a tunnel in the lower portion of the active region. Prior to the formation of the above opening portion, a film capable of being selectively removed, such as a silicon nitride film, is formed over the whole surface for protecting the surface of the active region. After the thin oxide film on the upper portion of the tunnel is removed, silicon doped with highly concentrated n-type impurity, for example phosphorous, is deposited by chemical vapor deposition reaction or the like to fill the tunnel therewith.

The impurity is then diffused from the silicon film to the SOI layer on the tunnel by heat-treatment, to form a highly concentrated collector region. After that, the silicon layer added with a highly concentrated impurity, which is formed on the main surface, is subjected to patterning, and the emitter, base and collector electrodes made of metal are formed, thus completing a transistor.

Since any heat-treatment at a high temperature is not performed after the formation of the above collector region, the diffusion of the impurity is extremely small, the abrupt impurity profile can be kept. In addition, the above collector region may-be formed by vapor-phase diffusion and then the tunnel is filled with a low resistance conductor film, in place of the impurity diffusion from the silicon film. The above low resistance conductor film may be made of a metal capable of being formed by chemical vapor deposition reaction such as tungsten (W) or aluminum (Al) or metal silicide or the like, other than silicon. This film may be a multi-layer film of the above materials. Moreover, in the above-described fabrication method, the collector region is formed after the formation of the emitter region; however, these regions may be simultaneously or reversely formed. An ultra-thin SOI MOS transistor may be formed on the multi-layered SOI substrate by the known method.

In the above fabrication method, the multi-layered SOI structure is used; however, the present invention is applied to an SOI substrate which is formed by forming an insulator or the like on the surface of a first usual silicon substrate, planarizing the surface by mechanochemical polishing, directly bonding a second substrate to the first substrate, and thinning the thickness of the first substrate by grinding and polishing from the rear surface side of the first substrate. In this case, by leaving a film which is replaced by the other low resistance conductor film in the subsequent process, such as a silicon film, on the first usual silicon substrate by patterning, the silicon film is disposed under the SOI structure after the formation of the SOI substrate. To the structure thus obtained, the fabrication method for the multi-layered SOI substrate can be applied. In this case, the buried low resistance conductor layer can be subjected to patterning in the designed shape. Accordingly, this may be applied to the formation of a buried gate electrode of an MOS transistor having a structure in which the gate electrode is buried.

According to the present invention, there can be obtained an SOI substrate in which an MOS transistor and a vertical bipolar transistor enabling an ultra-high speed operation are formed on the same SOI film. This makes it possible to improve the drivability of an ultra-thin SOI MOS transistor having an ultra-high integration density, to realize a BiCMOS large scale integrated circuit having the excellent feature of the ultra-thin SOI MOS transistor combined with the high speed operation of the bipolar transistor, and to improve the performance of a large size computer.

Moreover, in the fabrication of a semiconductor device, the epitaxial growth process can be eliminated. The epitaxial growth process requires a high processing temperature. In particular, a cleaning treatment by vapor phase must be performed on the surface of the substrate at a high temperature for obtaining the perfect crystal growth, which makes it difficult to avoid the out-diffusion of the impurity from the underlayer impurity layer and the impurity diffusion to the epitaxial layer during the growth. Consequently, it is difficult to keep the abrupt impurity profile in the, highly concentrated collector region after the epitaxial growth process.

Another disadvantage of the epitaxial growth process lies in making it difficult to handle on a large scale, resulting in the increased cost of the semiconductor device. According to the present invention, the above disadvantages can be solved by eliminating the epitaxial growth process. Therefore, there can be formed a semiconductor device having a highly concentrated collector region with an extremely abrupt impurity profile and excellent characteristics at a low cost.

Moreover, according to the present invention, since the collector region is formed after all of the high temperature heat-treatment processes are completed, the collector lead-out region can be formed of a low resistance conductor such as a metal material, thereby significantly reducing the collector resistance.

DETAILED DESCRIPTION

Hereinafter, the present invention will be described in detail by way of embodiments. For a clearer understanding, essential portions are enlarged in the figures. Moreover, material of each portion, the conductivity of a semiconductor layer and the fabricating condition are, of course, not limited to the description of the following embodiments.

Embodiment 1

Figure 1:
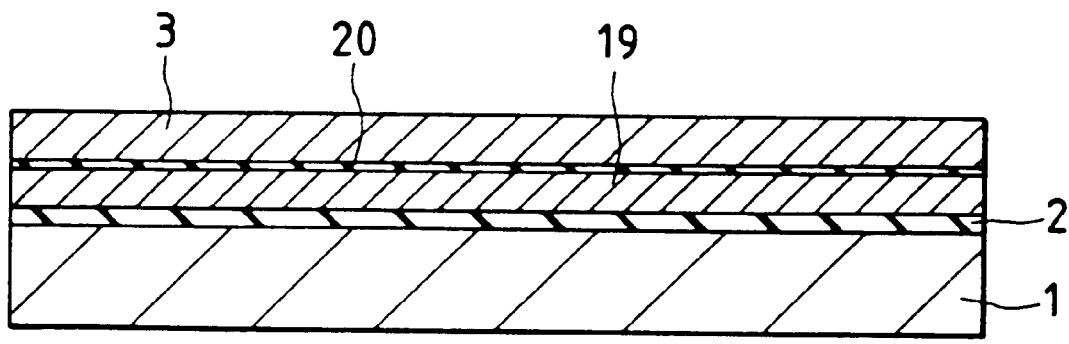
FIG. 1 is a sectional view showing a semiconductor substrate according to a first embodiment of the present invention.
Figure 2:
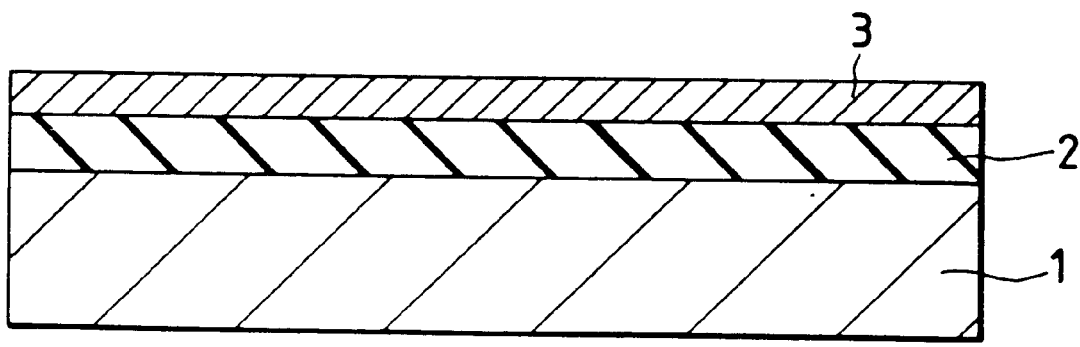
FIG. 2 is a sectional view showing a prior art semiconductor substrate.
Figure 3:
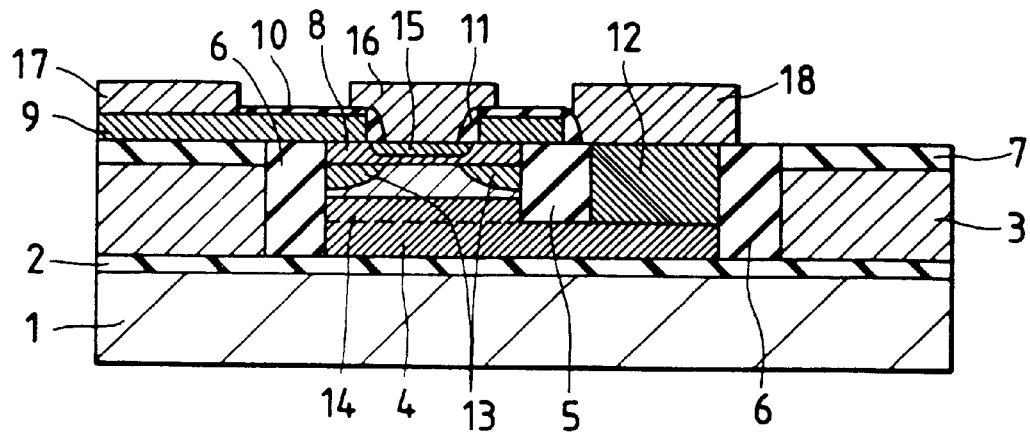
FIG. 3 is a sectional view showing a prior art semiconductor device.
Figure 4:
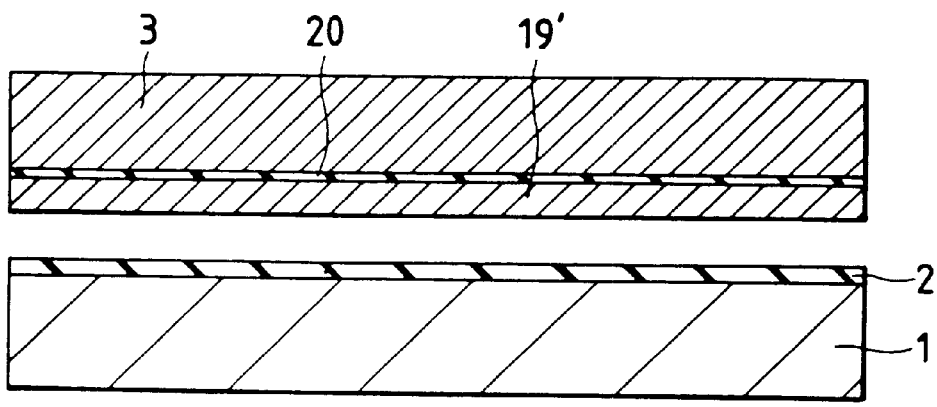
FIG. 4 is a process diagram of the first embodiment of the present invention.

FIGS. 1 and 4 are sectional views for illustrating a multi-layered SOI substrate and its fabrication method according to the present invention. In this embodiment, as a supporting substrate 1, there was used an n-type single crystalline silicon substrate having a face orientation (100), a resistivity of 10 Ωcm, and a diameter of 12.5 cm. The flatness over the whole surface of the supporting substrate 1 was 2 µm or less, and the root mean square of the surface roughness per a micro-region of 0.5 µm$^2$ was extremely flat, 4 nm or less.

On the main surface of the supporting substrate 1, a silicon dioxide film (hereinafter, referred to as "oxide film") 2 having a thickness of 500 nm was formed by the known thermal oxidation. Moreover, there was separately prepared a silicon substrate 3 having the same specification as the above supporting substrate 2, on which an oxide film 20 having a thickness of 10 nm and a silicon film 19 having a thickness of 500 nm were layered on the main surface in this order. The above silicon film 19 was formed at 520° C. by chemical vapor deposition (CVD) using $Si_2N_6$ (disilane) as a source gas. The deposited film thus obtained was amorphous, and the root mean square of the surface roughness was extremely flat, 4 nm or less.

Foreign matters such as particles were removed from the surfaces of the oxide film 2 and the silicon film 19 by a known cleaning process. After that, as shown in FIG. 4, the surfaces of the oxide film 2 and the silicon film 19 were tightly contacted with each other under a dust-free environment not to generate bubbles at the interface thereof, thus directly bonding the oxide film 2 and the silicon film 19 to each other. To increase the bonding strength between the oxide film 2 and the silicon film 19, they were heat-treated for 1 hr at 1100° C. By this heat-treatment, the bonding strength between the oxide film 2 and the silicon film 19 reached the same order of Si—Si bond strength of the single crystalline silicon substrate.

Next, the thickness of the silicon substrate 3 was thinned from the rear surface of the silicon substrate 3 by known grinding and polishing techniques to the extent that the single crystalline silicon substrate 3 having the uniform thickness of 500 nm was left on the oxide film 2 as shown in FIG. 1.

As is apparent from FIG. 1, in this SOI substrate, the semiconductor thin film 19 and the thick insulator 2 are layered under the thin single crystalline silicon layer 3 by way of the thin insulator 20. Consequently, as described later, an ultra-thin SOI MOS transistor and a vertical bipolar transistor can be formed on the same supporting substrate 1. This makes it possible to realize a large scale integrated circuit enabling an ultra-high speed operation and having an ultra-high integrated density.

In this embodiment, the surface of the thick oxide film 2 on the supporting substrate 1 is directly bonded to the surface of the silicon film 19; however, the above oxide film 2 may be formed on the silicon film 19 by CVD or the like and may be directly bonded to the surface of the supporting substrate 1 on which the oxide film is not formed.

Moreover, in this embodiment, the two silicon oxide films 2 and 20 and the silicon layer 19 are interposed between the supporting substrate 1 and the SOI layer 3; however, the present invention is not limited to this structure, and may be variously modified. For example, the materials and the number of the layers formed between the supporting substrate and the SOI layer may be different from those in this embodiment. The order of the layering each layer may be suitably changed, and the other layer may be inserted in the designed layers. The position where the wafer direct bonding is performed, that is, the position where two surfaces are opposed and directly bonded to each other may be suitably selected according to the semiconductor device to be formed.

Embodiment 2

In the first embodiment, as the supporting substrate, there was used a silicon substrate 1 on which a multi-layered insulator 2 made of an oxide film having a thickness of 500 nm and a silicon nitride film formed by CVD and having a thickness of 50 nm was formed on the surface; and as the semiconductor substrate 3 which become the SOI layer, a single crystalline substrate of GaAs (compound semiconductor) was used. On the main surface of the semiconductor substrate 3, a silicon oxide film 20 having a thickness of 10 nm was formed by plasma CVD, and in place of the above silicon film 19, a Ge film having a thickness of 300 nm was formed by vacuum deposition method.

Like the first embodiment, the supporting substrate 1 and the semiconductor substrate 3 were directly bonded to each other by tightly contacting the multi-layered insulator 2 and the Ge film 19 with each other and pressurizing them, and they were heat-treated at 600° C. for reinforcing the bonding strength.

Next, like the first embodiment, the thickness of the semiconductor substrate 3 was thinned from the rear surface side to the extent that the SOI layer 3 composed of the single crystalline compound semiconductor having the uniform thickness of 300 nm was left on the oxide film 20.

In the SOI substrate formed in this embodiment, the supporting substrate 1 made of the semiconductor thin film 19, the thick insulator 2 and the silicon single crystalline substrate was formed under the thin SOI layer 3 made of the single crystalline compound semiconductor by way of the thin insulator 20. Consequently, as described later, a compound semiconductor transistor was able to be formed on the silicon supporting substrate excellent in the mechanical strength, thus obtaining the compound semiconductor transistor having a small base/collector stray capacitance and an ultra-high operating speed.

In this embodiment, the GaAs substrate was used as the compound semiconductor substrate 3 constituting the SOI layer; however, as the substrate, there may be used a GaAs substrate on which an n-type low resistance GaAs layer constituting an emitter semiconductor layer, an n-type GaAs layer constituting a buffer layer, a low resistance p-type GaAs layer constituting a base semiconductor layer, and an n-type GaAs layer constituting an intrinsic collector layer are sequentially layered by epitaxial growth process.

As the compound semiconductor substrate 3, not only GaAs but also InP may be used. Moreover, there may be used an InP substrate on which an n-type GaAs layer, an n-type emitter InP layer, an InGaAs buffer layer, a p-type base InGaAs layer, an n-type collector InGaAs layer are sequentially layered by epitaxial growth process.

In the case that semiconductor layers different in material from each other are layered on a compound semiconductor substrate, the process of thinning the above thickness for forming the SOI layer may be performed by the steps of thinning the thickness up to a designed value by grinding and polishing, and perfectly removing only the remaining GaAs layer or InP layer by chemical etching, for example using the InGaAs layer as the stopper, thereby finally leaving only the epitaxial layer.

Embodiment 3

A multi-layered SOI substrate was formed in the same manner as in the first embodiment, except that in place of the amorphous silicon film 19 as one bonding surface, a silicon nitride film 19' formed by CVD was used.

In the multi-layered SOI substrate formed in this embodiment, the silicon nitride film 19' and the thick insulator 2 are formed under the thin single crystalline silicon layer 3 by way of the thin insulator 20. Consequently, as described later, an ultra-thin SOI MOB transistor and a vertical bipolar transistor were able to be formed on the same supporting substrate, thus realizing a large scale integrated circuit enabling a high speed operation and having a high integration.

Moreover, in the multi-layered SOI substrate in this embodiment, since the silicon nitride film 19' is formed under the SOI layer 3, the tensile strength applied to the SOI layer 3 by the oxide film 2 is relaxed by the silicon nitride film 19'. As a result, the camber of the SOI substrate can be reduced to be 5 μm or less, that is, $\frac{1}{10}$ that of the SOI substrate without the silicon nitride film 19'. In this embodiment, even when a multi-layered film of the silicon nitride film layered on the silicon film is used in place of the silicon film 19, and which is directly bonded to the supporting substrate 1 having the thick oxide film 2, the same effect can be obtained.

Embodiment 4

Figure 5:
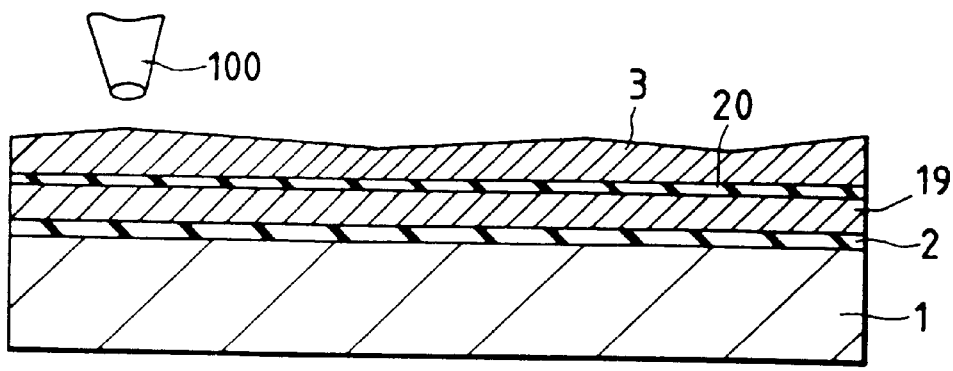
FIG. 5 is a process diagram of a fourth embodiment of the present invention.

FIG. 5 is a view showing a fourth embodiment of the present invention. In the first embodiment, the thickness of the SOI layer 3 was thinned to be about 3 μm by the grinding and polishing, and the thickness distribution in the wafer of the SOI layer 3 was measured by an optical method and the measured data were stored in a computer. This measurement was performed such that the surface of the SOI layer 3 was divided into 1,024 pieces, and the thickness was expressed as the function of the position of the region for each region.

Next, the SOI substrate was put in a micro-wave dry etching machine using $SF_6$ as a reaction gas, and a specified portion of the SOI layer 3 was selectively etched by a plasma beam 100 with a restricted diameter of 1 mm. The etching was performed by controlling the etching amount on the basis of the film thickness distribution previously measured. By the etching, the thickness of the SOI layer 3 was able to be controlled with an error being 5 nm or less to a design film thickness of 100 nm.

In the SOI substrate formed in this embodiment, the thin insulator 20, semiconductor film 19 and thin insulator 2 are formed under the SOI layer 3 made of the thin single crystalline silicon. Accordingly, as described later, an ultra-thin SOI MOS transistor and a vertical bipolar transistor could be formed on the same supporting substrate, thereby realizing a large scale integrated circuit enabling an ultra-high speed operation and having a high integration.

In the semiconductor substrate formed in this embodiment, the variation in the thickness of the SOI layer 3 is within 5 nm or less, and which is improved to be $\frac{1}{20}$ that of the SOI substrate formed in the embodiment 1.

Embodiment 5

A fifth embodiment of the present invention will be described with reference to FIGS. 6 to 9. An n-type single crystalline silicon substrate having a surface orientation (100), a resistivity of 10 Ωcm, and a diameter of 12.5 cm was used as an SOI substrate 3, and the multi-layered SOI substrate was formed in the same manner as in the fourth embodiment.

A deep groove and narrow groove were formed in the main surface of the multi-layered SOI substrate so as to reach a silicon oxide film 2 and a thin silicon oxide film 20 respectively, and a device isolation insulator 6 and a region separation insulator 5 were simultaneously buried in the deep groove and the narrow groove respectively.

Figure 6:
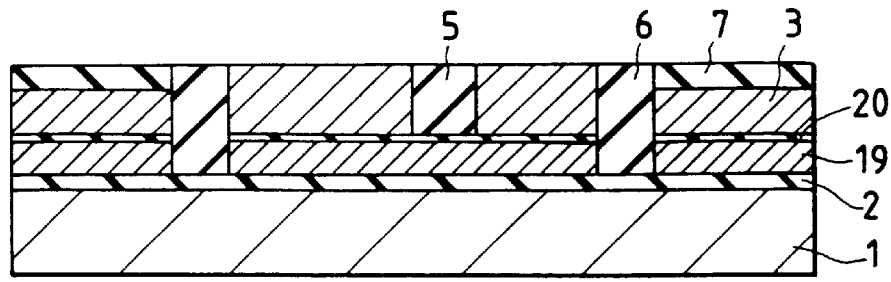
FIGS. 6 to 9 are process diagrams of a fifth embodiment of the present invention.
Figure 7:
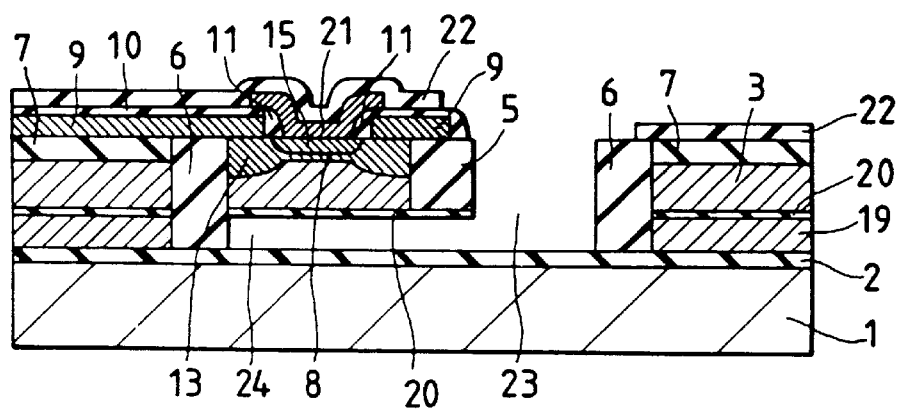
Figure 8:
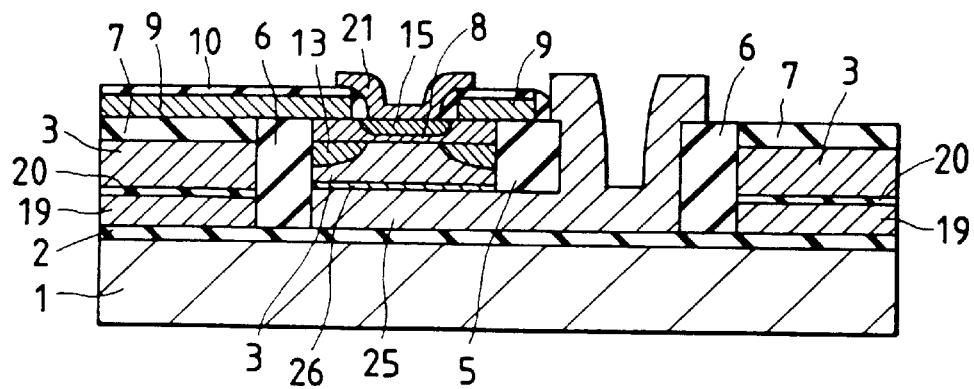

Next, as shown in FIG. 6, a field oxide 7 having a thickness of 300 nm was formed on the main surface of the SOI layer (single crystalline silicon layer) 3 excluding an active region.

An intrinsic base region 8, a base leadout electrode 9 made of a polycrystalline silicon film added with a highly concentrated p-type impurity, an electrode protection insulator 10 and an emitter-base separation insulator 11 were formed using the known fabrication method for a bipolar transistor.

A graft base region 13 was formed by heat-treatment, and an emitter leadout electrode 21 made of a polycrystalline silicon film added with a highly concentrated n-type impurity was formed, and then, an emitter region 15 having a shallow junction was formed by heat-treatment for a short time at a high temperature. In addition, the heat-treatment for formation of the graft base region 13 and the heat-treatment for the emitter region 15 may be made commonly and simultaneously performed.

After the emitter region 15 was formed, a nitride film 22 was deposited over the whole surface, and an opening portion 23 was formed. Then, of the above nitride film 22 and the SOI layer 3, the designed portions formed on the active region were selectively removed. The minimum dimension of the opening portion was 800 nm, and the depth thereof was set at the value reaching the silicon thin film 19. The silicon thin film 19 within the active region was selectively removed by way of the opening portion 23 by the known anisotropic etching, to form a tunnel 24 (see FIG. 7).

The thin oxide film 20 exposed to the ceiling portion of the tunnel 24 was selectively removed, to expose the bottom portion of the SOI layer 3, and then an amorphous silicon layer having a thickness of 500 nm and doped with highly concentrated phosphorous was formed over the whole surface by the known CVD using disilane thermally decomposed at 600° C., to fill the tunnel 24 and the opening portion 23 with the amorphous silicon layer 25. Subsequently, a shallow n-type highly concentrated collector region 26 was formed within the bottom portion of the SOI layer 3 on the upper portion of the tunnel 24 by heat-treatment for a short time at a high temperature. Next, the portion formed on the main surface, of the above silicon layer 25, was subjected to patterning on the basis of the designed circuit, and the remaining nitride film 22 was removed (see FIG. 8).

Figure 9:
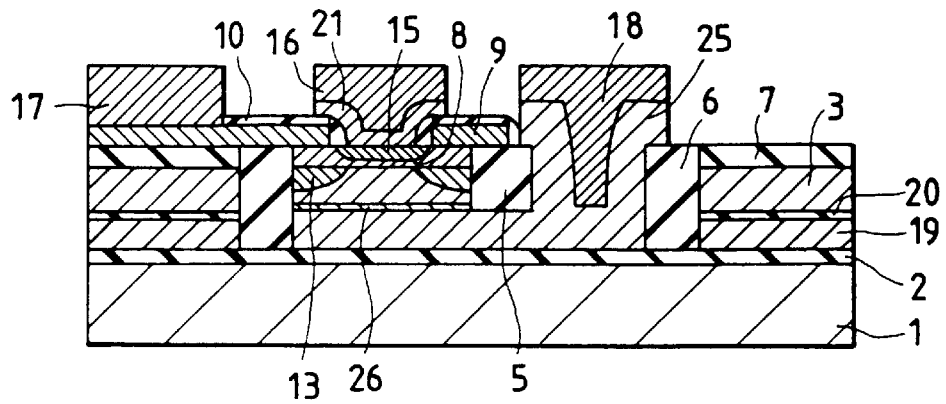

After an opening portion reaching the insulator 10 was formed, electrodes mainly containing Al including a base electrode 17, an emitter electrode 21 and a collector electrode 18 and metallization were formed (see FIG. 9).

In this embodiment, the epitaxial growth which has been essential in the prior art is eliminated, so that it becomes possible to eliminate the broadening of the highly concentrated collector region due to the high temperature heat treatment performed for the epitaxial growth, formation of the field oxide 7 and the like, and hence to form the highly concentrated collector region having an abrupt impurity distribution. Accordingly, even when the thickness of the layer corresponding to the conventional epitaxial layer is made as extremely thin as 200 nm, it becomes possible to realize an ultrahigh speed semiconductor device by making shallow each junction, without generation of a failure such as the short-circuit between the base and collector.

Moreover, in the conventional structure, Sb (antimony) was used as the n-type impurity for reducing the broadening of the collector region to the utmost; however, Sb is low in the allowable limit of the precipitation concentration, and thereby it is difficult to lower the resistance of the collector region. On the contrary, in this embodiment, since the broadening of the impurity concentration distribution is extremely small, there can be used an impurity capable of increasing the precipitation concentration and reducing the resistance, such as phosphorous. Therefore, the collector resistance of the semiconductor device formed in this embodiment was reduced to be half that of the conventional one.

In this embodiment, the npn-type bipolar transistor is shown; however, the present invention is not limited thereto, and a pnp-type bipolar transistor may be easily fabricated by the steps of previously forming an n-type base region and a p-type emitter region, and filling the opening portion 23 and the tunnel 24 with the silicon layer 25 doped with highly concentrated B (boron). Since the diffusion velocity of boron is extremely larger than that of the n-type impurity such as Sb, the high concentrated collector region in the conventional pnp-type transistor is broadened more than the npn-type transistor, and thereby it is difficult to form a thin epitaxial layer, and hence to make shallow the junction. However, in this embodiment, the epitaxial growth at a high temperature is not performed, so that the above difficulty can be easily solved.

Embodiment 6

Figure 10:
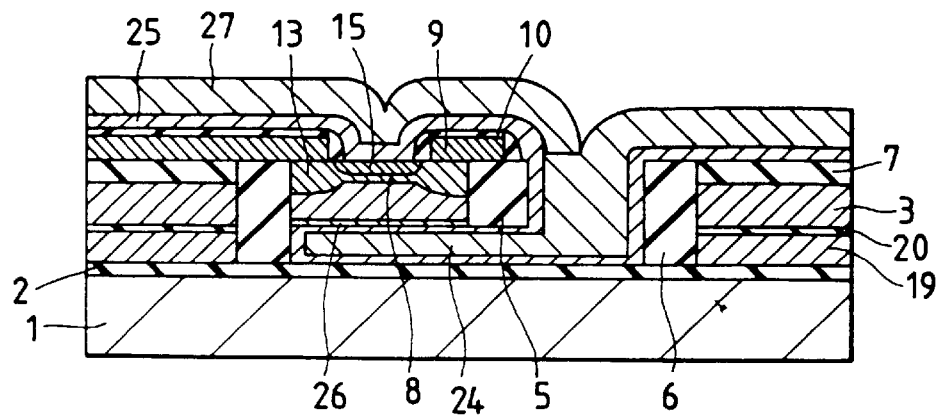
FIGS. 10 and 11 are process diagrams of a sixth embodiment of the present invention.
Figure 11:
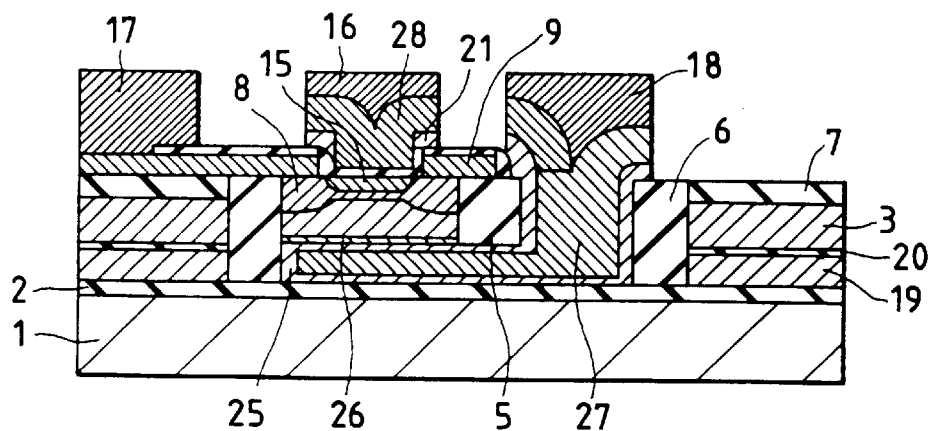

The sixth embodiment of the present invention will be described with reference to FIGS. 10 and 11. Like the fifth embodiment, an opening 23 and a tunnel 24 were formed, and as shown in FIG. 10, a silicon layer 25 having a thickness of 20 nm doped with highly concentrated phosphorous was formed over the whole surface by the known CVD, and a highly concentrated collector region 26 was formed by heat-treatment for a short time at a high temperature. In this case, a silicon layer 25 was formed on the inner surface of the above opening portion 23 and the tunnel 24.

Next, a tungsten (W) layer 27 having a thickness of 500 nm was formed by CVD, and the opening portion 23 and the tunnel 24 were filled therewith. In this embodiment, the formation of the silicon nitride film 22 was omitted, and an emitter region 15 was formed together with the highly concentrated collector region 26, to thus form a structure shown in FIG. 10.

The silicon layer 25 and the W layer 27 were subjected to patterning on the basis of the designed circuit, to form emitter leadout electrodes 21 and 28, and a collector leadout electrode 27. Moreover, like the embodiment 1, electrodes including a base metal electrode 17, an emitter metal electrode 16 and a collector metal electrode 18 and metallization were formed, to form a structure shown in FIG. 11.

In the semiconductor device formed in this embodiment, the collector resistance was reduced to be 1/10 or less that of the semiconductor device formed in the embodiment 1. Moreover, in this embodiment, the emitter region and the collector region can be simultaneously formed, so that each junction can be made shallow, thereby realizing an ultra-high speed transistor.

In this embodiment, the npn-type bipolar transistor is formed; however, a pnp-type bipolar transistor can be similarly fabricated by the steps of previously forming an n-type base region, and filling the opening portion 23 and the tunnel 24 with a silicon layer 25 doped with highly concentrated boron.

Embodiment 7

In the sixth embodiment, a device isolation insulator 6 was formed, to define an active region, and then an n-channel MOS transistor is fabricated in the designed active region of an SOI layer by the known method.

A region where a bipolar transistor should be formed-was covered with an insulator, and a gate oxide film, a gate electrode and a source/drain region of an MOS transistor were formed before the formation of a bipolar transistor. Next, the above insulator on the region where a bipolar transistor should be formed was selectively removed, and then a bipolar transistor was formed in the same manner as in the embodiment 6.

In the MOS transistor region, an opening portion reaching the silicon layer 19 was formed at the same time of the formation of the bipolar transistor region; but the selective etching for the silicon layer 19 was performed separately from the fabrication process for the bipolar transistor, and an oxide film 20 was not removed in the MOS transistor region. The formation of a tunnel 24, burying of a W film 27, and the formation of the W film 27 extending up to the main surface and its patterning were performed in the MOS transistor region, to form a fourth electrode for applying a voltage for controlling a threshold voltage of the MOS transistor.

In this embodiment, it becomes possible to form, within the same SOI substrate, both an ultra-thin SOI MOS transistor in which the source/drain stray capacitance is ½ that of the case using the usual semiconductor substrate, and a vertical high speed bipolar transistor in which the collector resistance is 1/10 that of the conventional one and the junction is made shallow, thereby realizing a large scale integrated circuit enabling an ultra-high speed operation and having an ultra-high integration density. In this embodiment, the silicon layer 25 and the W layer 27 are buried in the tunnel 24; however, an insulator such as a silicon oxide film may be buried in the tunnel 24 for further reducing the stray capacitance between the supporting substrate and the SOI layer.

In the MOS transistor region, a high resistance silicon layer may be left as being formed on the bottom portion of the SOI layer without the formation of the opening portion reaching the silicon layer 19.

Embodiment 8

An eighth embodiment of the present-invention will be described with reference to FIGS. 12 to 14.

Figure 12:
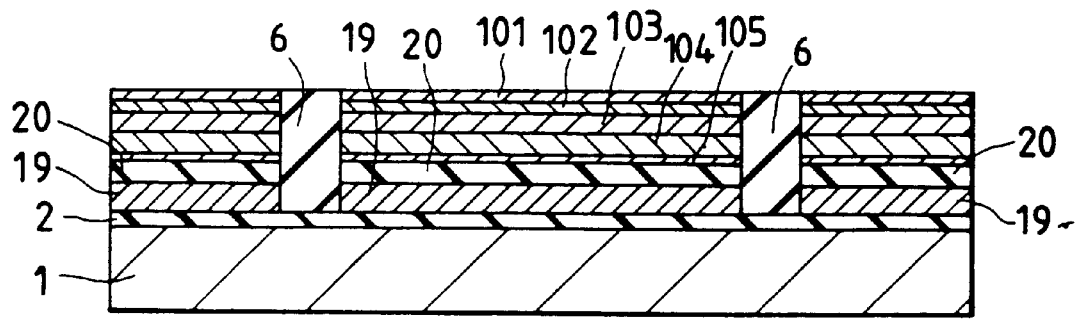
FIGS. 12 to 14 are process diagrams of an eighth embodiment of the present invention.

As shown in FIG. 12, like the fourth embodiment, on an InP substrate (not shown), there were sequentially layered by epitaxial growth process, an InGaAs layer 101 as a cap layer, an n-type low resistance InP layer 102 as an emitter layer, an InGaAs layer 103 as a buffer layer, a p-type InGaAs layer 104 as a base layer, an n-type InGaAs layer 105 as an intrinsic collector layer. Next, a silicon nitride film 20 having a thickness 100 nm was formed by plasma CVD, to form one substrate.

On the other hand, an oxide film 2 having a thickness of 500 nm and a Ge vapor deposition film 19 having a thickness of 500 nm were formed on the main surface of a single crystalline silicon substrate 1, to form a supporting substrate to be directly bonded with the above substrate.

The Ge vapor deposition film 19 and the n-type InGaAs layer 105 were opposed and tightly contacted with each other, and then directly bonded with each other, after which they were heat-treated at 300° C. for reinforcing the bonding strength. Next, the thickness of the InP substrate 3 was thinned up to 2 μm by grinding and polishing from the rear surface of the InP substrate 3. After that, the upper surface of the InGaAs cap layer 101 was exposed by removal of the InP substrate using a hydrochloric acid solution. The InGaAs layer was not etched with this hydrochloric acid solution, and only the InP substrate was removed, thereby exposing the surface of the InGaAs cap layer 101.

A groove was then formed on the InGaAs cap layer 101 so as to reach the oxide film 2, to define the designed active region, and the groove was filled with an oxide film 6.

Figure 13:
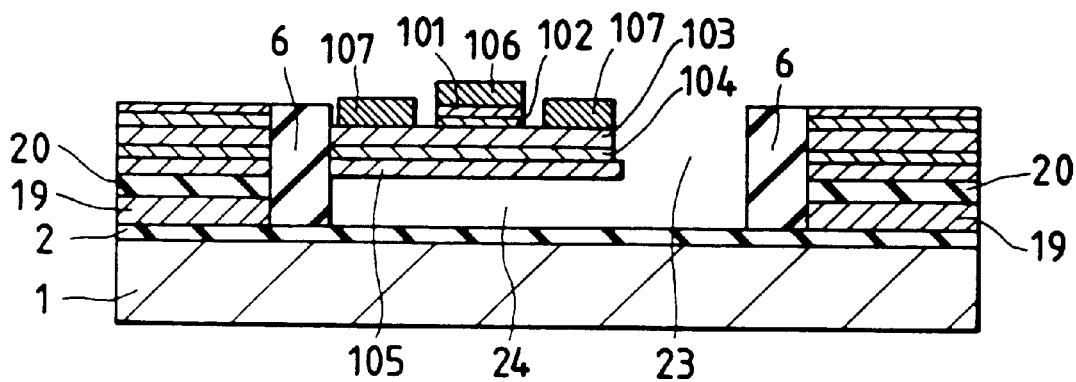

As shown in FIG. 13, an emitter electrode 106 was formed, and the exposed portions of the InGaAs cap layer 101 and the n-type low resistance emitter InP layer 102 were etched using the emitter electrode 106 as a mask, to expose the surface of the InGaAs buffer layer 103. In this case, the exposed portion of the InGaAs buffer layer 103 may be simultaneously etched.

Figure 14:
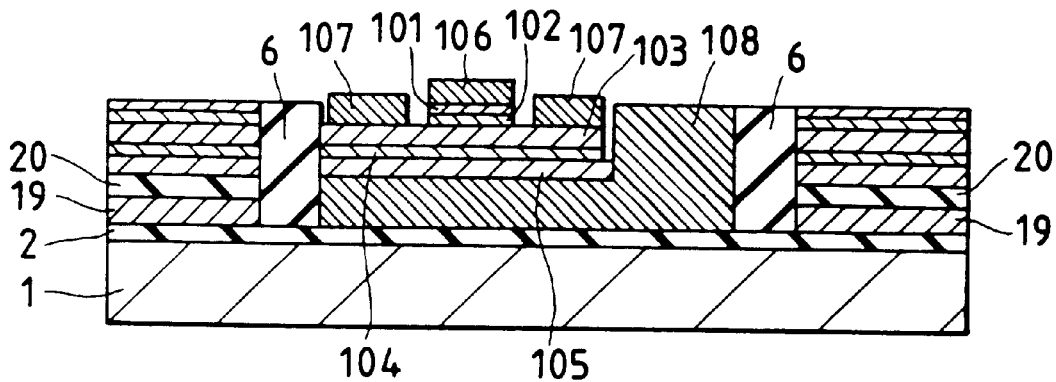

Next, as shown in FIG. 14, a base electrode 107 was formed in self-alignment with the emitter electrode 106, and a silicon nitride film was formed over the whole surface by plasma CVD. After that, an opening portion was formed on the designed region of this silicon nitride film by the known photoetching, and an opening portion 23 was formed on the surface so as to reach the Ge film 19 using the silicon nitride film as a mask. The Ge film 19 and the silicon nitride film 20 were then perfectly removed by the continued etching, to form a tunnel 24.

In the state where the regions of the emitter electrode 106 and the base electrode 107 were selectively covered, a W film was formed over the whole surface by CVD, to fill the tunnel 24 and the opening portion 23 with the W film 108. Moreover, a collector electrode 108 was formed, to form a heterojunction bipolar compound semiconductor transistor.

In this embodiment, the InP compound semiconductor transistor capable of higher speed operation than the conventional silicon bipolar transistor could be realized using the SOI structure. This makes it possible to extremely reduce the collector resistance and significantly reduce the collector/base stray capacitance, and hence to further enhance the high speed performance.

Embodiment 9

A ninth embodiment of the present invention will be described with reference to FIGS. 15 to 18.

Figure 15:
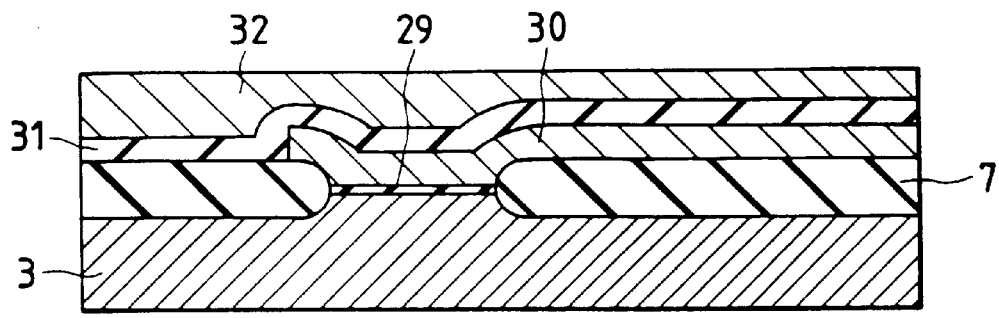
FIGS. 15 to 18 are process diagrams of a ninth embodiment of the present invention.

As shown in FIG. 15, a field oxide 7 having a thickness of 400 nm was selectively formed by a known method on a specified region of a silicon substrate 3 which was formed in the same specification as that of the single crystalline silicon substrate used in the seventh embodiment, to form a device isolation insulator. A thin silicon oxide film 29 having a thickness of 10 nm was formed on the surface of an active region separated by the field oxide 7. After that, an undoped amorphous silicon layer 30 having a thickness of 450 nm was formed, and was subjected to patterning so as to cover at least one portion of the active region and to extend on the field oxide.

A silicon oxide film 31 having a thickness of 500 nm was formed over the whole surface by CVD, and a polycrystalline silicon layer 32 was formed for planarization of the surface. In this embodiment, the film thickness of the above polycrystalline silicon layer 32 was set at 2.5 μm. Next, the surface of the polycrystalline silicon layer 32 was mechano-chemically polished to the extent that the root mean square of the surface roughness was 0.3 nm or less.

Figure 16:
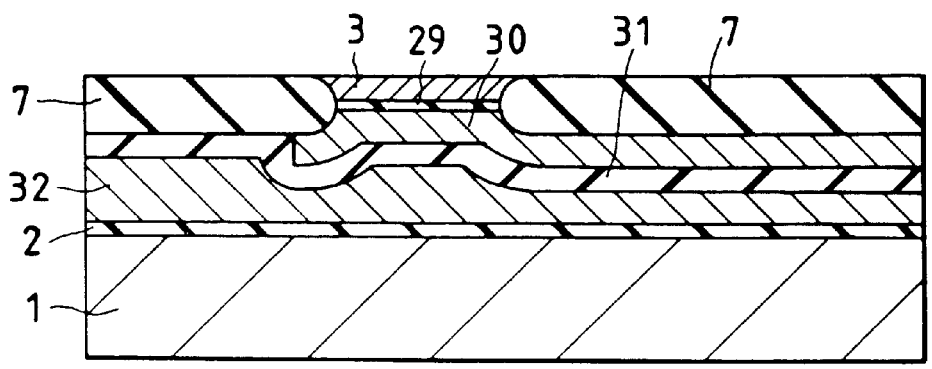

Next, as shown in FIG. 16, the polished surface of the polycrystalline silicon layer 32, and the surface of a silicon thermally grown oxide film 2 having a thickness of 200 nm which was formed on the main surface of a second silicon substrate 1 separately prepared were opposed and tightly contacted with each other, and then directly bonded with each other. The second silicon substrate 1 was formed in the same specification as that of the single crystalline silicon substrate 3. When the bonding surfaces of the silicon thermally grown oxide film 2 and the polycrystalline silicon layer 32 were extremely cleaned, the micro-roughness of each surface was 5 nm or less, and the flatness of the whole substrate was 1 μm or less, the whole surfaces can be bonded uniformly without generation of any void.

After the above direct bonding, heat-treatment for 30 min at 900° C. was performed for improving the bonding strength. The bonding strength was examined by a stretch test after the heat-treatment, which showed a large value reaching the same order of Si—Si bond strength of a single crystalline silicon, that is, about 800 kg/cm².

The thickness of the single crystalline silicon substrate 3 was thinned to be about 10 μm by grinding from the rear surface side, and which was mechano-chemically polished using a polishing solution added with ethylene diamine pyrocatechol. The polishing was performed by the steps of pushing the silicon substrate 3 on the polishing cloth provided on a rotating disk at a pressure of 1.9×104 Pa while supplying a polishing solution. The polishing velocity of the field oxide 7 exposed along with the progress of polishing was extremely slower ($1/10^4$ times or less) than that of the single crystalline silicon substrate 3. Accordingly, the single crystalline substrate 3 was perfectly planarized, and was made in the same level of the rear surface of the field oxide 7. Thus, there was obtained the single crystalline SOI layer 3 having a thickness of about 200 nm which was isolated by the field oxide 7 in accordance with the active region.

Figure 17:
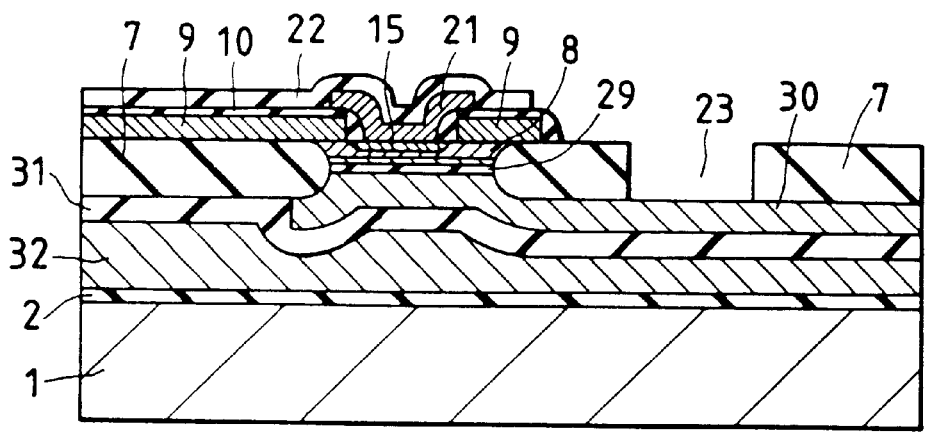

Next, as shown in FIG. 17, like the embodiment 6, there were formed an intrinsic base region 8, a base leadout electrode, an electrode protection insulator 10, an emitter-base separation insulator 11, a graft base region 13, an emitter leadout electrode 21 and an emitter region 15. Moreover, a silicon nitride film 22 was formed over the whole surface, unnecessary portions being removed, and an opening 23 having a minimum dimension of 600 nm reaching an Si film 30 was formed on the designed region of the above field oxide 7.

Figure 18:
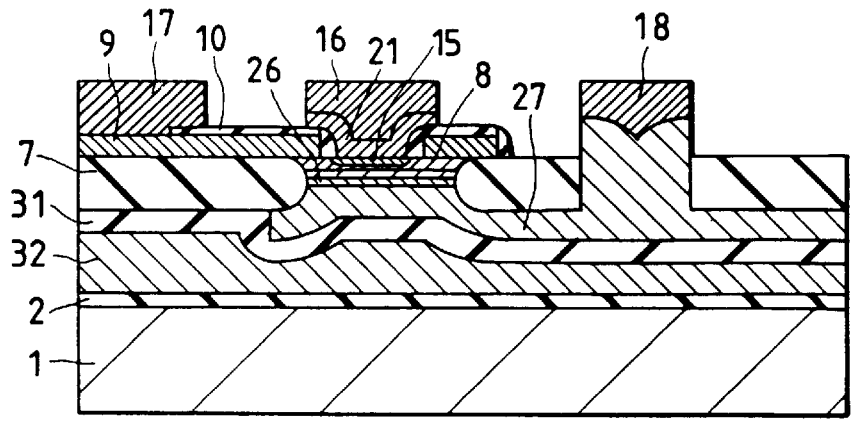

As shown in FIG. 18, the Si film 30 was perfectly removed, and a tunnel reaching the lower portion of the single crystalline Si layer (active region) was formed. A thin oxide film 29 on the upper portion of the tunnel was then removed, and a shallow highly concentrated collector region 26 was formed by diffusion of phosphorous to the bottom portion of the SOI layer by way of the tunnel by rapid vapor diffusion using phosphine ($PH_3$) as a diffusion source. Moreover, the tunnel and the opening portion 23 were filled with a W film 27 by the known CVD. A collector leadout electrode 27 was formed by patterning of the W film 27, and electrodes mainly containing Al including a base electrode 17, an emitter electrode 16 and a collector electrode 18 were formed by the known method.

According to this embodiment, the collector leadout electrode 27 having a low resistance can be formed so as to extend to a specified portion on the basis of the designed circuit irrespective of the position of the active region. Accordingly, it becomes possible to extremely improve the degree of the freedom of the circuit design and to enhance the integration density of the semiconductor device. Moreover, the thickness of the SOI layer on which the regions of the emitter, base and collector are formed can be specified by the film thickness of the field insulator 7 being the thermally grown oxide film formed the single crystalline Si substrate which is excellent in the controllability of the film thickness. Accordingly, as compared with the semiconductor devices formed in the sixth and seventh embodiments, each region can be made shallow to the utmost, and the operation can be further increased.

In this embodiment, for a clearer understanding, the highly concentrated collector region 26 was formed after the formation of the base region 8 and the emitter region 15; however, the emitter region 15 and the highly concentrated region 26 may be simultaneously formed, or the emitter region 15 may be formed after the formation of the highly concentrated collector region 26 in the same manner as in this embodiment. This embodiment may be, of course, applied to the fabrication of the pnp-type transistor having the reversed conductivity.

Embodiment 10

A tenth embodiment of the present invention will be described with reference to FIGS. 19 and 20. In this embodiment, a semiconductor device was fabricated in the same manner as in the ninth embodiment, except that a p-type singe crystalline Si substrate 3 was used.

Figure 19:
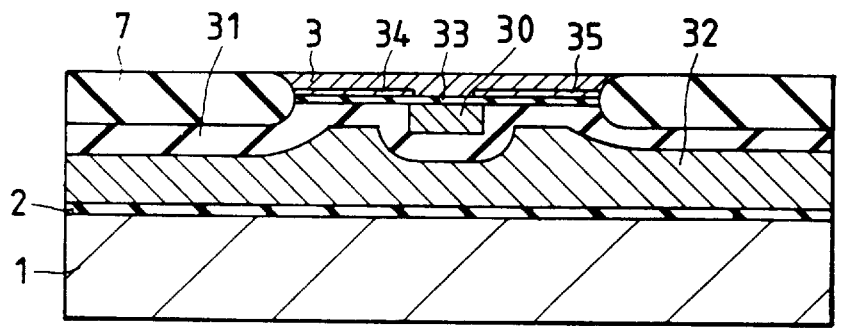
FIGS. 19 and 20 are process diagrams of a tenth embodiment of the present invention.

As shown in FIG. 19, in the ninth embodiment, the film thickness of the field oxide 7 was 150 nm, and a gate insulator 33 made of a silicon oxide film having a thickness of 5 nm was formed on the surface of an Si substrate 3 in the active region. After the gate insulator 33 was formed, an undoped amorphous Si film having a thickness of 450 nm was formed, like the ninth embodiment. After that, unnecessary portions were removed by the known photoetching, and an Si film 30 having the same pattern as the gate electrode was formed. The Si film 30 was formed so as to cover part of the active region and to extend on the field oxide 7.

An n-type source region 34 and a drain region 35 which were doped with high concentrated impurities were formed on the surface region of the Si substrate 3 by implanting ions of As using the Si film 30 as a mask.

Next, an oxide film 31 having a thickness of 500 nm and a polycrystalline Si film 32 having a thickness of 2.5 $\mu$m were formed over the whole surface, and like the ninth embodiment, the surface of the polycrystalline Si film 32 was mechano-chemically polished. After that, the surface of the polycrystalline Si film 32 was directly bonded with a single crystalline Si substrate 1 on the surface of which a thermally grown oxide film 2 was formed. Moreover, like the ninth embodiment, a thin SOI layer 3 was formed by grinding and polishing the Si substrate 3 from the rear surface thereof, to form a structure shown in FIG. 19. The layer thickness of the SOI layer 3 was about 75 nm.

Figure 20:
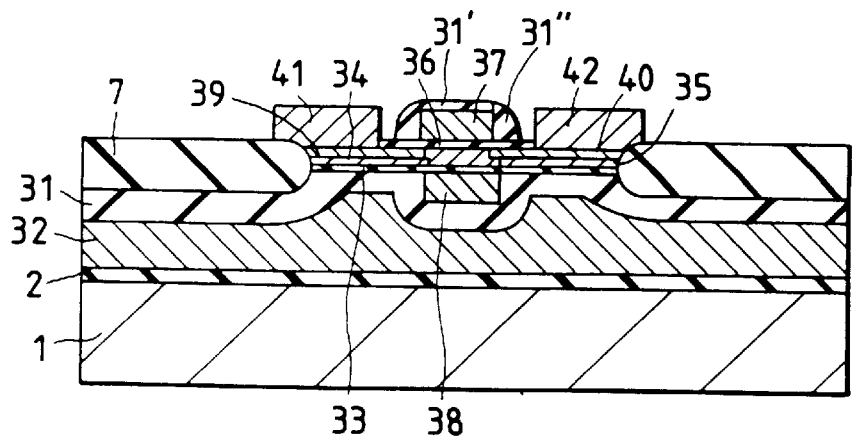

As shown in FIG. 20, a second gate insulator 36 having a thickness of 5 nm was formed on the surface of the active region of the SOI layer 3, and an opening portion (not shown) having the minimum dimension of 600 nm was formed on the designed portion of the field oxide 7, to expose part of the Si film 30. Next, the Si film 30 exposed by way of the above opening portion was selectively removed, to form a tunnel reaching the bottom portion of the SOI layer 3.

A W film having a thickness of 300 nm was formed by CVD, to fill the tunnel therewith, thus forming a W gate electrode 38. A silicon oxide film added with phosphorous in a slight amount was formed for protecting the surface of the W film formed on the main surface, and subsequently the silicon oxide film and the W film were subjected to patterning in the same shape, to form a gate protection insulator and a second gate electrode 37.

After a silicon oxide film 31' added with phosphorous in a slight amount was formed over the whole surface, an insulator 31" was selectively left on the side walls of the second gate electrode 37 by anisotropic etching for preventing the second gate electrode 37 from being exposed.

Next, a second source region 39 and a second drain region 40 were formed by implanting ions of As using the second gate electrode 37 as a mask. In the above fabricating process, the first gate electrode 38 and the second gate electrode 37 were made of the same metal film (W film) simultaneously formed, and which were electrically connected to each other by way of an opening portion. Moreover, the first source region 34 and the second source region 39, and the first drain region 35 and the second drain region 40 were respectively set to have the junction depths to be connected to each other.

After the unnecessary portion of the second gate insulator 36 was removed, a source electrode 41 and a drain electrode 42, which were made mainly of Al, were formed by a known method, to form a structure shown in FIG. 20.

In this embodiment, an MOS transistor having a structure in which the second gate electrode 37 and the first gate electrode 38 are provided on the upper and lower surfaces of the thin single crystalline SOI layer 3, respectively. Accordingly, the whole of the thin single crystalline SOI layer 3 can be operated as a channel, so that the drive current can be increased to be twice or more that of the MOS transistor having the conventional structure. Moreover, since the above gate electrodes 37 and 38 are made of the same material having a low resistance, it becomes possible to obtain a semiconductor device being excellent in the high speeds operation characteristic and being large in the degree of freedom of the circuit design. In particular, since the first W gate electrode 38 is formed so as not to be affected by the high temperature heat-treatment in the direct bonding process, it is possible to ensure a high reliability although the thickness of the gate insulator 33 is as extremely thin as 5 nm.

In this embodiment, the first and second gate electrodes 38 and 37 were made of the W film formed by CVD; however, they are not limited thereto, and may be made of a low resistance metal film such as Al, Mo, Ti, and Ta, a metal silicide film, or a semiconductor thin film having a conductivity type different from that of the source/drain region. Moreover, a p-channel type transistor and an n-type transistor may be formed, and gate electrodes of the p-channel and n-channel transistors may be formed of metal films or metal silicide films different in the material, or semiconductor films different in the concentration of the added impurity and the conductivity type.

Embodiment 11

Figure 21:
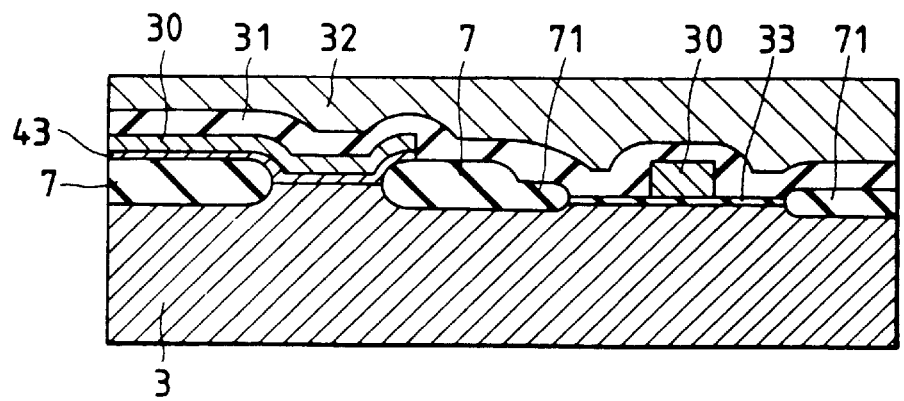
FIGS. 21 to 23 are process diagrams of an eleventh embodiment of the present invention.

An eleventh embodiment of the present invention will be described with reference to FIGS. 21 to 23.

First, in the ninth embodiment, a field insulator 7 having a thickness of 400 nm was formed by a known thermal oxidation process on the region of a single crystalline Si substrate 3 excluding the region where a bipolar transistor should be formed. After the designed portion of the field insulator 7 was removed, a second field insulator 71 having a thickness of 100 nm was formed by a known thermal oxidation process so as to surround a second active region on which an MOS transistor should be formed.

The unnecessary portion of a silicon nitride film 43 having a thickness of 5 nm used to form the second field insulator 71 was removed, and the portion of the silicon nitride film 43 on the region in which the bipolar transistor should be formed was left. Next, a gate insulator 33 having a thickness of 5 nm was formed on the second active region by a known thermal oxidation process.

An undoped amorphous Si film 30 having a thickness of 200 nm was formed over the whole surface and the unnecessary portion was then removed, so that a pattern was formed so as to cover the above first and second active regions and to extend on the field oxides 7 and 71. After a source region 39 and a drain region 40 were formed on a region where the MOS transistor should be formed, a silicon oxide film 31 having a thickness of 500 nm and a polycrystalline Si film 32 having a thickness of 2.5 µm were layered over the whole surface, like the ninth embodiment, and the layered surface was polished for planarization. The source region 39 and the drain region 40 were formed such that the junction depths eventually became 60 nm.

Figure 22:
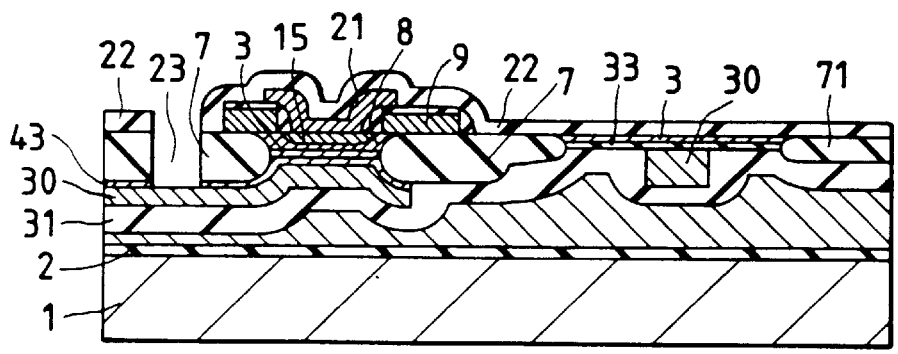

Next, as shown in FIG. 22, the surface of the polycrystalline Si film 32 was directly bonded to a thermally grown oxide film 2 formed on the surface of a single crystalline Si substrate 1 separately prepared. Then, the thickness of the Si substrate 3 was thinned by grinding and polishing from the rear surface thereof, to form a thin SOI layer 3. The thickness of the SOI layer 3 was 200 nm in the region on which a bipolar transistor should be formed, and 50 nm in the region on which an MOS transistor should be formed.

In the region on which a bipolar transistor should be formed, like the ninth embodiment, there were formed an intrinsic base region 8, a base leadout electrode 9, an electrode protection insulator 10, an emitter-base separation insulator 11, a graft base region 13, an emitter leadout electrode 21 and an emitter region 15. In the region on which the MOS transistor should be formed, a second gate insulator made of a thermally grown oxide film having a thickness of 5 nm was formed on the surface of the SOI layer 3 in the same manner as in the tenth embodiment, and the silicon nitride film 22 was formed over the whole surface.

An opening portion 23 having a minimum dimension of 400 nm was formed in the field insulators 7 and 71, and the silicon nitride film 43 formed thereunder, to expose the upper surface of the Si pattern extending from the bottom portions of the bipolar transistor and the MOS transistor.

Figure 23:
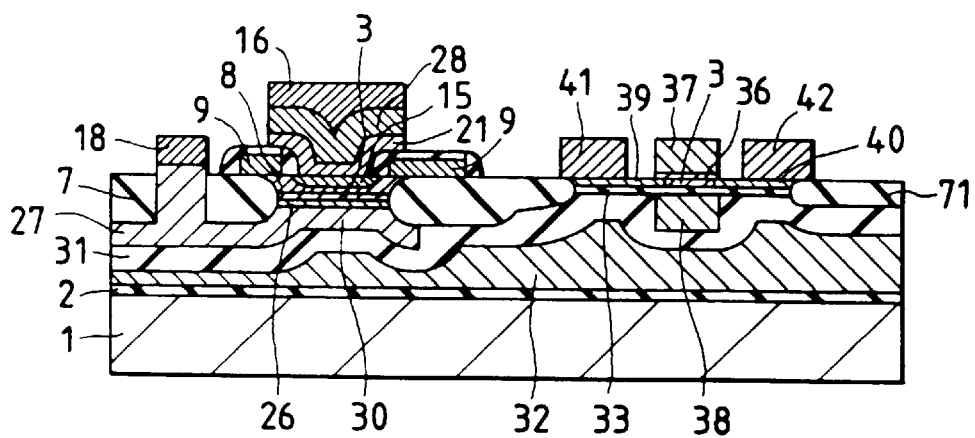

The Si pattern 30 was removed by way of the opening portion 23, to form a tunnel, and as shown in FIG. 23, an n-type highly concentrated collector region 26 was formed by doping of an impurity on the bottom surface of the SOI layer 3 on the upper portion of the tunnel. Next, the silicon nitride film 2 was removed, and the tunnel was filled with a W film, to form a collector leadout electrode 27 in the same manner as in the ninth embodiment.

Since the thin gate insulator 33 was left on the lower portion of the SOI layer 3 in the bottom portion of the MOS transistor region, a highly concentrated region was not formed, and only a gate electrode 38 mare of the W film was formed. The W film was formed by CVD to a thickness of 200 nm.

The W film formed on the main surface was subjected to patterning on the basis of the designed circuit, to form an emitter leadout electrode 28 and a second gate electrode 37, and electrodes made of an Al film including a base electrode 18, an emitter electrode 16, a source electrode 41 and a drain electrode 42 were formed by a known method.

In the semiconductor device formed in this embodiment, each of the emitter, base and collector was formed to have the abrupt and shallow junction in the SOI layer having a thickness of 200 nm. Thus, a bipolar transistor enabling high speed operation and a high speed MOS transistor in which metal gate electrodes were formed on both surfaces of the thin single crystalline SOI layer having a thickness of 50 nm can be formed on the same substrate. Accordingly, it becomes possible to further increase the high speed operation of the conventional Bi-CMOS semiconductor device having a large capacity and enabling a high speed operation, in which the bipolar transistor was disposed together with the MOS transistor.

Embodiment 12

A twelfth embodiment of the present invention will be described with reference to FIGS. 24 and 25.

First, an SOI layer 3 having a thickness of 200 nm which was separated into two parts by a field insulator 7 was formed in the same manner as in the embodiment 7. Next, in the region of the above SOI layer 3 on which an npn-type bipolar transistor should be formed, like the seventh embodiment, there were formed a p-type intrinsic base region 8, a base leadout electrode 9 doped with highly concentrated p-type impurity, a graft base region 13, an electrode protection insulator 10, an emitter-base separation insulator 11, an n-type emitter leadout electrode 21 and an emitter region 15. Moreover, in the other region of the above SOI layer 3 on which a pnp-type bipolar transistor should be formed, there were similarly formed an n-type intrinsic base region 43, a base leadout electrode 44 added with highly concentrated n-type impurity, a graft base region, an electrode protection insulator 10, an emitter-base separation insulator 11, an emitter leadout electrode 45 made of a p-type polycrystalline Si film and a p-type emitter region 46.

Figure 24:
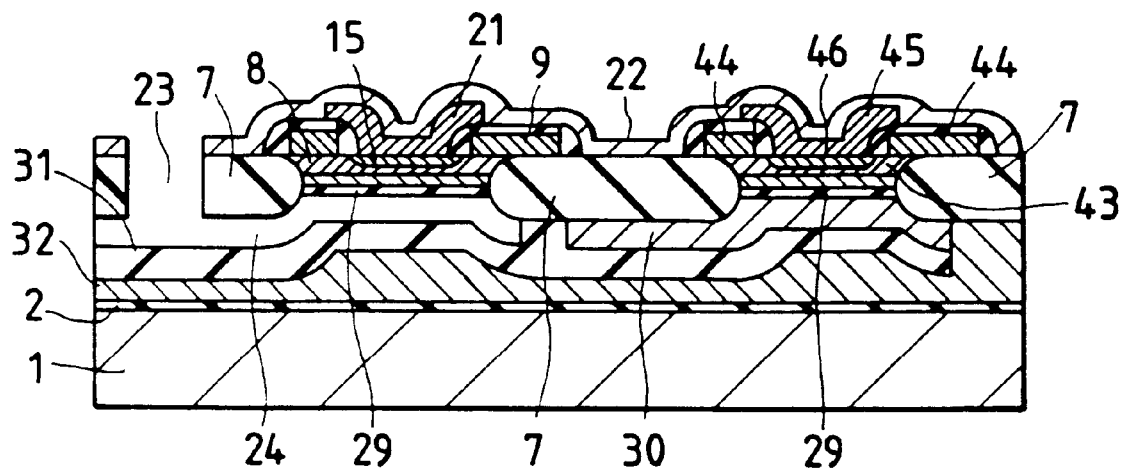
FIGS. 24 and 25 are process diagrams of a twelfth embodiment of the present invention.
Figure 25:
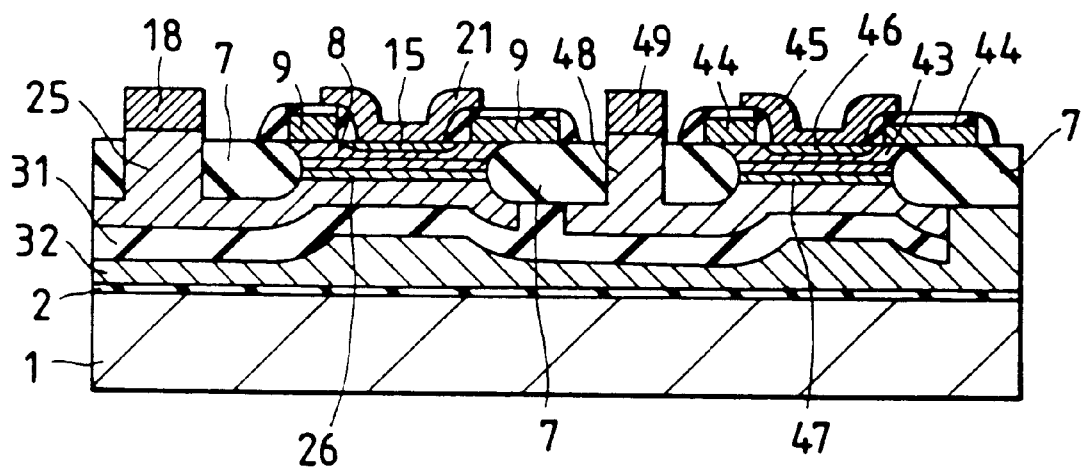

As shown in FIG. 24, a silicon nitride film 22 was formed over the whole surface, and an opening portion was formed at a specified portion of the silicon nitride film 22 and the field insulator 7, to expose the upper surface of the Si film 30 extending from the bottom portion of the region where the npn-type transistor should be formed to the field insulator 7. Next, the Si film 30 was selectively removed by way of the opening portion 23, to form a tunnel 24.

Like the embodiment 3, the thin oxide film 29 on the upper portion of the tunnel 24 was removed, the n-type highly concentrated collector region 26 was formed, the tunnel 24 was filled with a W film, and the collector leadout electrode 25 was formed. A silicon oxide film doped with phosphorous in a slight amount was formed on the designed portion including the collector leadout electrode 25 for protecting the surface, and then an opening portion was formed in the silicon oxide film and the field insulator 7, thus exposing the upper surface of the Si film 30 extending from the bottom portion of the region where the pnp-type transistor should be formed to the field oxide 7. The Si film 30 was removed by way of the opening portion 23 to form a tunnel, and the thin silicon oxide film 29 was removed and a p-type highly concentrated collector region 47 was formed on the bottom surface of the exposed SOI layer by the rapid vapor diffusion method using diborane ($B_2H_6$) as a vapor diffusion source.

A W film was formed by chemical vapor deposition, to fill the tunnel therewith, and a collector leadout electrode 48 was formed. Finally, electrodes made of an Al film including electrodes 18 and 19 and metallization were formed on the basis of the designed circuit, thus forming a structure shown in FIG. 25.

In this embodiment, the npn-type and the npn bipolar transistors can be disposed on the same substrate. Namely, the complimentary bipolar transistor having a shallow junction structure in the SOI layer having an extremely thin thickness of 200 nm can be formed. Therefore, it becomes possible to further increase the high speed operation of the semiconductor device enabling a high speed operation at a small power consumption.

Embodiment 13

Figure 26:
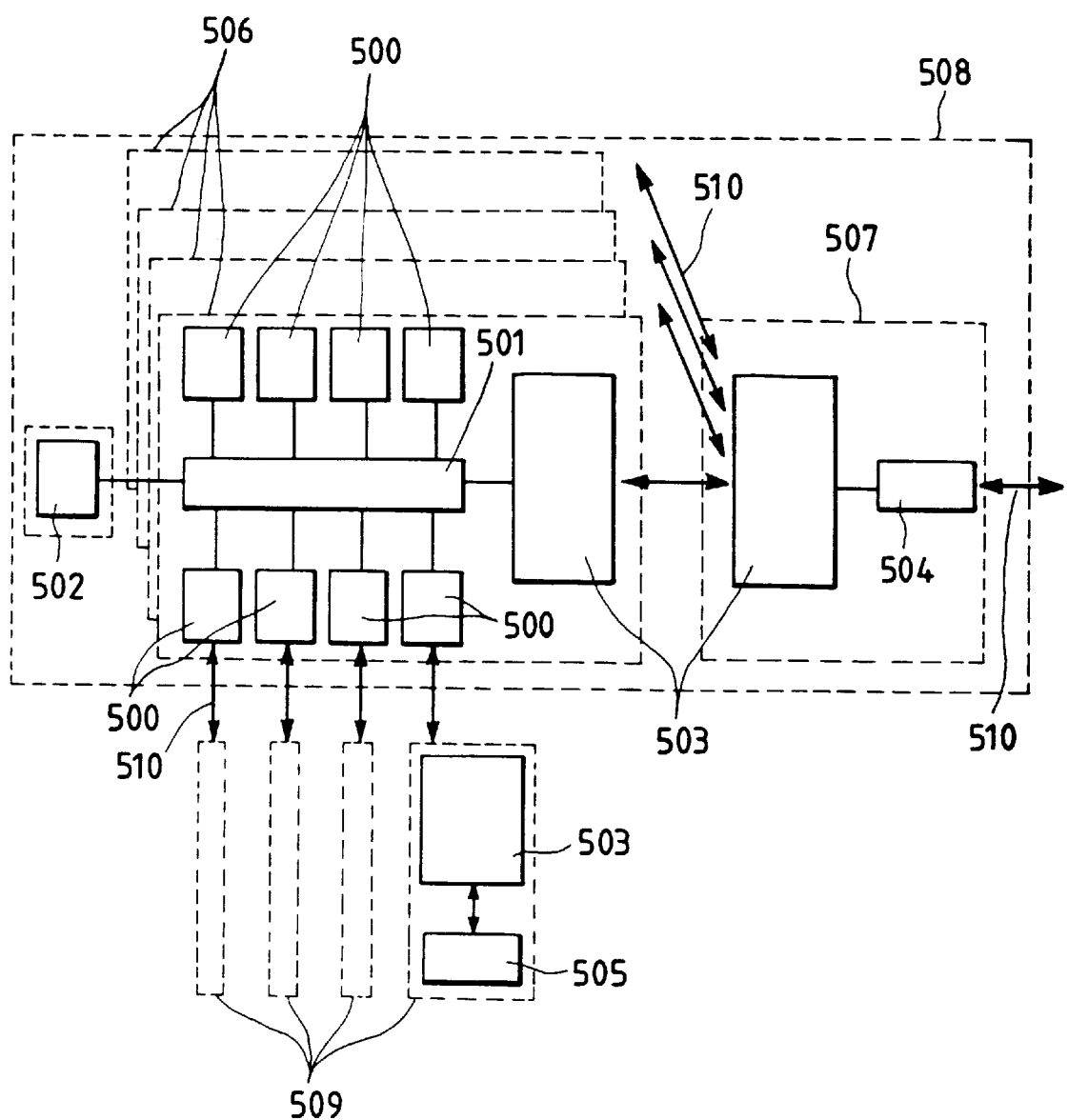
FIG. 26 is a diagram of showing the construction of a computer according to a thirteenth embodiment of the present invention.

A thirteenth embodiment of the present invention will be described with reference to FIG. 26. In this embodiment, the semiconductor device of the present invention is applied to a large size high speed computer in which a plurality of processors 500 for instruction and arithmetic processing are connected in parallel to each other.

In this embodiment, since the integration of the semiconductor device is high, the processors 500 for instruction and arithmetic processing, a memory control unit 501, and a main memory unit 502 were formed in a silicon semiconductor chip having one side of about 10 to 30 mm. The processors 500, the memory control unit 501 and a data communication interface unit 503 made of a compound semiconductor integrated circuit were mounted on the same ceramic substrate 506. Moreover, the data communication interface unit 503 and a data communication control unit 504 were mounted on the same ceramic substrate 507. A ceramic substrate, on which these ceramic substrates 506 and 507, and the main memory unit 502 were mounted, was mounted on a substrate having one side of about 500 cm or less, to form a central processor unit 508 of the large size computer. The data communications within the central processor unit 508, between a plurality of the central processor units, and between the processors 500 and substrates 509 each mounting the data communication interface unit 503 and an input/output processor. 505 were performed using optical fibers 510 shown in the arrows of the figure. In the computer, the semiconductor devices of the processor 500, memory control unit 501 and main memory unit 502 were operated at a high speed in parallel to each other, and the data communication was performed using an optical medium, so that the numbers of instruction per second could be extremely increased.

Embodiment 14

Figure 27:
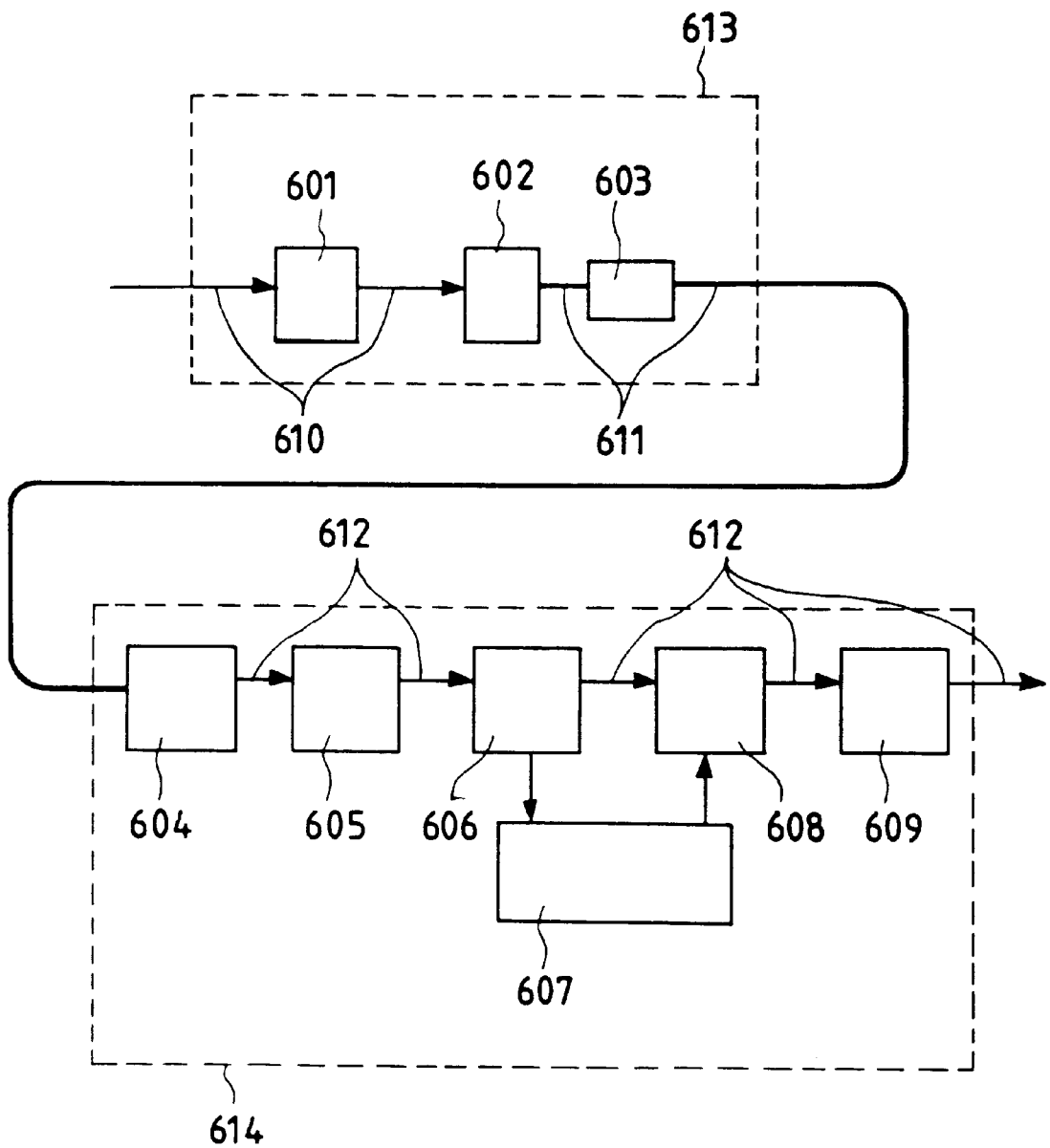
FIG. 27 is a diagram showing the construction of an optical transfer system according to a fourteenth embodiment of the present invention.

FIG. 27 is a view showing an optical transmission system according to the embodiment 14. In this fourteenth embodiment, the semiconductor device formed in the thirteenth embodiment was used for an optical transmission module 613 for transmitting data at a high speed, and an optical receiving module 614 for receiving data at a high speed.

In this embodiment, the optical transmission module 613, which was composed of a digital multiplexing circuit 601 for processing an output signal 610, and a semiconductor laser drive analog circuit 602 for driving a semiconductor laser 603, was formed using the semiconductor devices fabricated in the third embodiment. Moreover, the optical receiving module 614, which was composed of a pre-amplifier 605 for amplifying an input signal 612 converted from a transmitted optical signal 611 by a photodiode 604, and analog circuits such as an automatic gain control amplifier 606, clock recovery <circuit 607, and a detective circuit 608, and a demultiplexer 609 being a digital circuit, was formed of the semiconductor devices fabricated in the third embodiment.

The semiconductor devices formed in the third embodiment was able to be operated at a high speed (cut off frequency and maximum cut off frequency: 100 GHz), so that a signal with a large capacity (30 G bits per second) could be transmitted and received at an ultrahigh speed.

As is apparent from the above description, according to the present invention, a semiconductor substrate can be formed without the formation of a highly concentrated collector region and an epitaxial layer on the upper surface thereof. Conventionally, it has been difficult to suppress the impurity diffusion to the epitaxial layer in the epitaxial process, and hence to realize a highly concentrated collector region having an abrupt impurity profile. According to the present invention, the collector region can be formed after the high temperature heat-treatment performed, for example for forming the field insulator, so that the highly concentrated collector region having an extremely abrupt impurity profile can be realized. Accordingly, the thickness of each region of the base and emitter formed on the upper portion of the highly concentrated collector region can be made shallow to the utmost within the range of the recent fabrication technique. Therefore, by use of the semiconductor substrate of the present invention, the operation speed of the semiconductor device can be significantly improved.

Moreover, the epitaxial process, which is difficult to handle on a large scale and to reduce the cost of the semiconductor device, is eliminated, so that it becomes possible to fabricate a high performance semiconductor device at a low cost.

Moreover, since the collector leadout region can be formed of a low resistance metal material, it becomes possible to extremely reduce the collector resistance, and hence to improve the operation speed of the semiconductor device and the integrated circuit using the same.

What is claimed is:

1. A method of fabricating a semiconductor device comprising:

layering a first film made of an insulator, a second film made of an amorphous or polycrystalline semiconductor, a fourth film made of an insulator, a fifth film made of an insulator and a third film made of a single crystalline semiconductor on a main surface of a supporting substrate; and forming a gate electrode made of a conductor on the third film via a gate insulator, wherein said layering of said first, second, fourth, fifth and third film is performed by directly bonding a first multi-layered structure in which said first film is layered on said supporting substrate, and a second multi-layered structure on which said second, third, fourth and fifth films are layered on a second substrate to each other such that said first film and said second film are opposed and tightly contacted with each other, and by thinning the thickness of said second multi-layered structure from a rear surface side.

2. A method of fabricating a semiconductor device according to claim 1, wherein a thickness of said fourth film made of an insulator is thinner than a thickness of said third film made of a single crystalline semiconductor, and a the thickness of said third film is thinner than a thickness of said first film made of an insulator and a thickness of said second film made of an amorphous or polycrystalline semiconductor.

3. A method of fabricating a semiconductor device comprising;

layering a first film made of an insulator, a second film made of a conductor, and a third film made of a single crystalline semiconductor on a main surface of a supporting substrate;

forming a device isolation region extending from said third film to said first film by way of said second film;

forming at least part of a transistor on a designated region of said third film;

etching a designated portion of said third film surrounded by said device isolation region for forming an opening portion, and etching said second film by way of said opening portion for removing part of said second film surrounded by said device isolation region thereby forming a tunnel; and filling said tunnel with a conducting material for forming a pn-junction with said third film.

4. A method of fabricating a semiconductor device according to claim 3, and further including forming a fourth film made of an insulator between said said second film and said third film.

5. A method of fabricating a semiconductor device according to claim 4, wherein said layering of said first film, said second film, said third film, and said fourth film is performed by directly bonding a first multi-layered structure on which said first film and said second film are layered, and a second multi-layered structure on which said third film and said fourth film are layered to each other such that said second film and said fourth film are opposed and tightly contacted with each other, and by reducing the thickness of the second multi-layered structure from a rear surface thereof.

* * * * *

UNITED STATES PATENT AND TRADEMARK OFFICE
CERTIFICATE OF CORRECTION

PATENT NO. : 6,004,865
DATED : December 21, 1999
INVENTOR(S) : Masatada Horiuchi et al It is certified that error appears in the above-identified patent and that said Letters Patent is hereby corrected as shown below:

In the Abstract,
Line 5: After "substrate" insert -- . --.

Column 1,
Line 67, change "a-region" to -- a region -- .

Column 2,
Line 6, change "are" to -- is -- .
Line 52, after "base" delete ",'.

Column 3,
Line 37, change "designed" to -- designated -- .

Column 4,
Line 25, change "simultaneously or reversely formed" to -- formed simultaneously or in reverse order -- .
Line 66, change "the , highly" to -- the highly -- .

Column 5,
Line 2, change "making it difficult to handle" to -- difficullty of handling it -- .
Line 43, after "diagram" delete "of".

Column 6,
Line 19, before "not" insert -- so as -- .
Line 57, change "designed" to designated -- .

Column 7,
Line 1, change "become" to -- became -- .
Line 49, change "designed' to -- specified --.
Line 63, change "MOB" to -- MOS -- .

Column 10,
Line 41, before "embodiment" insert -- first -- ;after "embodiment" delete "1" .
Line 55, change "designed" to -- designated -- .

Column 11,
Line 57, change "designed" to -- designated -- .

UNITED STATES PATENT AND TRADEMARK OFFICE
CERTIFICATE OF CORRECTION

PATENT NO.    : 6,004,865
DATED         : December 21, 1999
INVENTOR(S)   : Masatada Horiuchi et al It is certified that error appears in the above-identified patent and that said Letters Patent is hereby corrected as shown below:

Column 12,
Line 3, change "designed" to -- designated -- .
Line 55, change "extremely" to -- thoroughly -- .
Line 57 change "can" to -- could -- .

Column 13,
Line 14, change "embodiment 6" to -- sixth embodiment -- .
Line 22, change "designed" to -- designated -- .
Line 48, after "formed" insert -- from -- .

Column 14,
Line 15, change "high" to -- highly -- .

Column 15,
Line 10, change" speeds" to -- speed -- .

Column 16,
Line 30, change "mare" to -- made -- .

Column 17,
Line 19, change "designed" to -- designated --.

UNITED STATES PATENT AND TRADEMARK OFFICE
CERTIFICATE OF CORRECTION

PATENT NO.   : 6,004,865
DATED        : December 21, 1999
INVENTOR(S)  : Masatada Horiuchi et al It is certified that error appears in the above-identified patent and that said Letters Patent is hereby corrected as shown below:

Column 17,
Line 38, Change "npn-type" to -- pnp-type -- ; change "npn bipolar" to -- npn-type bippolar --.

Column 18,
Line 48, Before "performed" insert -- is --.

Column 19,
Line 24, After "and a " delete "the".

Signed and Sealed this

Twenty-eighth Day of August, 2001

*Attest:*

*Attesting Officer*

NICHOLAS P. GODICI
*Acting Director of the United States Patent and Trademark Office*